(12) United States Patent
Tang (10) Patent No.: US 12,144,233 B2
(45) Date of Patent: Nov. 12, 2024

(54) DISPLAY PANEL AND MOBILE TERMINAL

(71) Applicant: Wuhan China Star Optoelectronics Semiconductor Display Technology Co., Ltd., Hubei (CN)

(72) Inventor: Rui Tang, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/626,606

(22) PCT Filed: Jan. 7, 2022

(86) PCT No.: PCT/CN2022/070692
§ 371 (c)(1),
(2) Date: Jan. 12, 2022

(87) PCT Pub. No.: WO2023/123535
PCT Pub. Date: Jul. 6, 2023

(65) Prior Publication Data
US 2024/0049576 A1    Feb. 8, 2024

(30) Foreign Application Priority Data
Dec. 28, 2021  (CN) .......................... 202111625987.2

(51) Int. Cl.
*H10K 59/80*  (2023.01)
*H10K 59/35*  (2023.01)

(52) U.S. Cl.
CPC ......... *H10K 59/879* (2023.02); *H10K 59/352* (2023.02)

(58) Field of Classification Search
CPC .......................... H10K 59/879; H10K 59/352
See application file for complete search history.

(56) References Cited

U.S. PATENT DOCUMENTS

2021/0367013 A1* 11/2021 Yuan ................. H10K 59/65

FOREIGN PATENT DOCUMENTS

| CN | 111933679 |   | 11/2020 |
|----|-----------|---|---------|
| CN | 111933679 | A * | 11/2020 |
| CN | 113031828 |   | 6/2021 |
| CN | 113224106 |   | 8/2021 |
| CN | 113270562 |   | 8/2021 |

(Continued)

OTHER PUBLICATIONS

Grounds of Reason of Rejection Dated Mar. 21, 2024 From the Korean Intellectual Property Office Re. Application No. 10-2022-7016496 and Its Translation Into English. (16 Pages).

(Continued)

*Primary Examiner* — Mary Ellen Bowman (57) ABSTRACT

A display panel and a mobile terminal are disclosed. The display panel includes a substrate, a first refractive index layer, and a second refractive index layer. The first refractive index layer includes a plurality of first openings in a functional display area and a plurality of second openings in a main display area. The second refractive index layer is filled in the first openings and the second openings, and a refractive index of the second refractive index layer is greater than a refractive index of the first refractive index layer. A number density of the first openings is greater than a number density of the second openings.

16 Claims, 4 Drawing Sheets

(56) References Cited

FOREIGN PATENT DOCUMENTS

| | | |
|---|---|---|
| CN | 113764602 | 12/2021 |
| JP | 2015-215388 | 12/2015 |
| WO | WO 2021/227197 | 11/2021 |

OTHER PUBLICATIONS

Notice of Reason(s) for Rejection Dated Jan. 30, 2024 From the Japanese Patent Office Re. Application No. 2022-510859 and Its Translation Into English. (8 Pages).
Official Action Dated Apr. 18, 2024 From the US Patent and Trademark Office Re. U.S. Appl. No. 17/626,606. (08 Pages).

\* cited by examiner

DISPLAY PANEL AND MOBILE TERMINAL

RELATED APPLICATIONS

This application is a National Phase of PCT Patent Application No. PCT/CN2022/070692 having International filing date of Jan. 7, 2022, which claims the benefit of priority of Chinese Patent Application No. 202111625987.2 filed on Dec. 28, 2021. The contents of the above applications are all incorporated by reference as if fully set forth herein in their entirety.

FIELD AND BACKGROUND OF THE INVENTION

The present disclosure relates to the field of display technologies, and more particularly, to a display panel and a mobile terminal.

In recent years, under-screen optical display panels have become more and more popular among consumers. Taking under-screen cameras as an example, when under-screen camera areas and main display areas display pictures at a same time, at large viewing angles, visual brightness of the under-screen camera areas is brighter than visual brightness of the main display areas.

Therefore, it is necessary to provide a display panel and a mobile terminal to solve the above technical problem.

Technical problem: the present disclosure provides a display panel and a mobile terminal, which can relieve the technical problem of brighter visual brightness in the under-screen camera areas at large viewing angles.

SUMMARY OF THE INVENTION

To solve the above problem, an embodiment of the present disclosure provides technical solutions as follows:

An embodiment of the present disclosure provides a display panel, which has a functional display area and a main display area surrounding the functional display area and includes:

a substrate;

a first refractive index layer disposed on one side of the substrate and including a plurality of first openings and a plurality of second openings, wherein, the first openings are distributed in the functional display area, and the second openings are distributed in the main display area; and a second refractive index layer disposed on one side of the first refractive index layer away from the substrate and filled in the first openings and the second openings, wherein, a refractive index of the second refractive index layer is greater than a refractive index of the first refractive index layer;

wherein, a number density of the first openings is greater than a number density of the second openings.

Preferably, the display panel further includes a light-emitting functional layer disposed between the substrate and the first refractive index layer, and the light-emitting functional layer includes a plurality of first sub-pixels disposed in the functional display area and a plurality of second sub-pixels disposed in the main display area; wherein, a number density of the first sub-pixels is equal to a number density of the second sub-pixels.

Preferably, in a top view direction of the display panel, all the first sub-pixels are disposed in the first openings, a part of the second sub-pixels are disposed in the second openings, and another part of the second sub-pixels are disposed outside the second openings.

Preferably, a ratio of a number of the first openings to a number of the first sub-pixels is a first ratio, and a ratio of a number of the second openings to a number of the second sub-pixels is a second ratio; and wherein, the first ratio is greater than the second ratio.

Preferably, on a first cross-section, a bottom width of the first openings is greater than a width of the first sub-pixels, a bottom width of the second openings is greater than a width of the second sub-pixels, and the first cross-section is perpendicular to the display panel; and a difference value between a diameter of a bottom circumscribed circle of the first openings and a diameter of a circumscribed circle of a light-emitting surface corresponding to the first sub-pixels is a first difference value, a difference value between a diameter of a bottom circumscribed circle of the second openings and a diameter of a circumscribed circle of a light-emitting surface corresponding to the second sub-pixels is a second difference value, and the first difference value is greater than or equal to the second difference value.

Preferably, the first difference value is greater than zero and is less than or equal to 1.5 um, and the second difference value is greater than zero and is less than or equal to 1.5 um.

Preferably, an acute included angle between a side wall of the first openings and a first plane is a first included angle, and an acute included angle between a side wall of the second openings and the first plane is a second included angle; and wherein, the first plane is parallel to the substrate, and the first included angle is greater than or equal to the second included angle.

Preferably, the first included angle is greater than or equal to 70° and is less than or equal to 85°, and the second included angle is greater than or equal to 70° and is less than or equal to 85°.

Preferably, the first sub-pixels are one of first color pixels, second color pixels, or third color pixels, a light-emitting area of the first color pixels is greater than a light-emitting area of the second color pixels, and the light-emitting area of the second color pixels is greater than a light-emitting area of the third color pixels; the second sub-pixels are one of fourth color pixels, fifth color pixels, or sixth color pixels, a light-emitting area of the fourth color pixels is greater than a light-emitting area of the fifth color pixels, and the light-emitting area of the fifth color pixels is greater than a light-emitting area of the sixth color pixels; light-emitting colors of the first color pixels, the second color pixels, and the third color pixels are different, the light-emitting color of the first color pixels is same as a light-emitting color of the fourth color pixels, the light-emitting color of the second color pixels is same as a light-emitting color of the fifth color pixels, and the light-emitting color of the third color pixels is same as a light-emitting color of the sixth color pixels; a ratio of a number of the first openings corresponding to the first color pixels to a number of the first color pixels is a third ratio, a ratio of a number of the second openings corresponding to the fourth color pixels to a number of the fourth color pixels is a fourth ratio, a ratio of a number of the first openings corresponding to the second color pixels to a number of the second color pixels is a fifth ratio, a ratio of a number of the second openings corresponding to the fifth color pixels to a number of the fifth color pixels is a sixth ratio, a ratio of a number of the first openings corresponding to the third color pixels to a number of the third color pixels is a seventh ratio, and a ratio of a number of the second openings corresponding to the sixth color pixels to a number of the sixth color pixels is an eighth ratio; and the third ratio is greater than the fourth ratio, and the fifth ratio, the sixth ratio, the seventh ratio, and the eighth ratio are all equal to each other; or the third ratio is greater than the fourth ratio, the fifth ratio is greater than the sixth ratio, and the seventh ratio is equal to the eighth ratio.

Preferably, the light-emitting color of the first color pixels is blue, the light-emitting color of the second color pixels is red, and the light-emitting color of the third color pixels is green.

Preferably, in a direction from a periphery of the functional display area to a center of the functional display area, a difference value between a diameter of a bottom circumscribed circle of the first openings and a diameter of a circumscribed circle of a light-emitting surface corresponding to the first sub-pixels is gradually increased, and an acute included angle between a side wall of the first openings and a horizontal plane is gradually increased.

An embodiment of the present disclosure further provides a mobile terminal, which includes a display panel, an under-screen optical module, and a terminal body, wherein, the under-screen optical module is correspondingly disposed in a functional display area, and the terminal body, the under-screen optical module, and the display panel are combined into one integrated structure.

The display panel has the functional display area and a main display area surrounding the functional display area and includes:
  a substrate;
  a first refractive index layer disposed on one side of the substrate and including a plurality of first openings and a plurality of second openings, wherein, the first openings are distributed in the functional display area, and the second openings are distributed in the main display area; and
  a second refractive index layer disposed on one side of the first refractive index layer away from the substrate and filled in the first openings and the second openings, wherein, a refractive index of the second refractive index layer is greater than a refractive index of the first refractive index layer;
  wherein, a number density of the first openings is greater than a number density of the second openings.

Preferably, the display panel further includes a light-emitting functional layer disposed between the substrate and the first refractive index layer, and the light-emitting functional layer includes a plurality of first sub-pixels disposed in the functional display area and a plurality of second sub-pixels disposed in the main display area; wherein, a number density of the first sub-pixels is equal to a number density of the second sub-pixels.

Preferably, in a top view direction of the display panel, all the first sub-pixels are disposed in the first openings, a part of the second sub-pixels are disposed in the second openings, and another part of the second sub-pixels are disposed outside the second openings.

Preferably, a ratio of a number of the first openings to a number of the first sub-pixels is a first ratio, and a ratio of a number of the second openings to a number of the second sub-pixels is a second ratio; and wherein, the first ratio is greater than the second ratio.

Preferably, on a first cross-section, a bottom width of the first openings is greater than a width of the first sub-pixels, a bottom width of the second openings is greater than a width of the second sub-pixels, and the first cross-section is perpendicular to the display panel; and a difference value between a diameter of a bottom circumscribed circle of the first openings and a diameter of a circumscribed circle of a light-emitting surface corresponding to the first sub-pixels is a first difference value, a difference value between a diameter of a bottom circumscribed circle of the second openings and a diameter of a circumscribed circle of a light-emitting surface corresponding to the second sub-pixels is a second difference value, and the first difference value is greater than or equal to the second difference value.

Preferably, the first difference value is greater than zero and is less than or equal to 1.5 um, and the second difference value is greater than zero and is less than or equal to 1.5 um.

Preferably, an acute included angle between a side wall of the first openings and a first plane is a first included angle, and an acute included angle between a side wall of the second openings and the first plane is a second included angle; and wherein, the first plane is parallel to the substrate, and the first included angle is greater than or equal to the second included angle.

Preferably, the first included angle is greater than or equal to 70° and is less than or equal to 85°, and the second included angle is greater than or equal to 70° and is less than or equal to 85°.

Preferably, the first sub-pixels are one of first color pixels, second color pixels, or third color pixels, a light-emitting area of the first color pixels is greater than a light-emitting area of the second color pixels, and the light-emitting area of the second color pixels is greater than a light-emitting area of the third color pixels; the second sub-pixels are one of fourth color pixels, fifth color pixels, or sixth color pixels, a light-emitting area of the fourth color pixels is greater than a light-emitting area of the fifth color pixels, and the light-emitting area of the fifth color pixels is greater than a light-emitting area of the sixth color pixels; light-emitting colors of the first color pixels, the second color pixels, and the third color pixels are different, the light-emitting color of the first color pixels is same as a light-emitting color of the fourth color pixels, the light-emitting color of the second color pixels is same as a light-emitting color of the fifth color pixels, and the light-emitting color of the third color pixels is same as a light-emitting color of the sixth color pixels; a ratio of a number of the first openings corresponding to the first color pixels to a number of the first color pixels is a third ratio, a ratio of a number of the second openings corresponding to the fourth color pixels to a number of the fourth color pixels is a fourth ratio, a ratio of a number of the first openings corresponding to the second color pixels to a number of the second color pixels is a fifth ratio, a ratio of a number of the second openings corresponding to the fifth color pixels to a number of the fifth color pixels is a sixth ratio, a ratio of a number of the first openings corresponding to the third color pixels to a number of the third color pixels is a seventh ratio, and a ratio of a number of the second openings corresponding to the sixth color pixels to a number of the sixth color pixels is an eighth ratio; and the third ratio is greater than the fourth ratio, and the fifth ratio, the sixth ratio, the seventh ratio, and the eighth ratio are all equal to each other; or the third ratio is greater than the fourth ratio, the fifth ratio is greater than the sixth ratio, and the seventh ratio is equal to the eighth ratio.

Beneficial effect: by defining the first openings and the second openings on a first transparent layer and filling a second transparent layer that has a larger refractive index into the first openings and the second openings to form micro-lens structures, wherein, the number density of the first openings defined in the functional display area is greater than the number density of the second openings defined in the main display area, the present disclosure can concentrate more light of large viewing angles in the functional display area. Therefore, a technical problem of brighter visual brightness at the large viewing angles in the functional display area can be relieved.

DESCRIPTION OF SPECIFIC EMBODIMENTS OF THE INVENTION

The present disclosure provides a display panel and a mobile terminal. In order to make the purpose, technical solutions, and effects of this disclosure clearer and more definite, the following further describes this disclosure in detail with reference to the drawings and embodiments. It should be understood that the specific embodiments described herein are only used to explain the disclosure, and are not used to limit the disclosure.

An embodiment of the present disclosure provides a display panel and a mobile terminal. They will be described in detail in the following. It should be noted that an order of description in the following embodiments is not meant to limit a preferred order of the embodiments.

Referring to FIGS. 1 to 7, an embodiment of the present disclosure provides a display panel 100, which has a functional display area A and a main display area B surrounding the functional display area A. The display panel 100 includes:
 a substrate 200;
 a first refractive index layer 500 disposed on one side of the substrate 200, wherein, the first refractive index layer 500 includes a plurality of first openings 510 and a plurality of second openings 520, the first openings 510 are distributed in the functional display area A, and the second openings 520 are distributed in the main display area B; and
 a second refractive index layer 600 disposed on one side of the first refractive index layer 500 away from the substrate 200 and filled in the first openings 510 and the second openings 520, wherein, a refractive index of the second refractive index layer 600 is greater than a refractive index of the first refractive index layer 500.

Wherein, a number density of the first openings 510 is greater than a number density of the second openings 520.

By defining the first openings and the second openings on a first transparent layer and filling a second transparent layer that has a larger refractive index into the first openings and the second openings to form micro-lens structures, wherein, the number density of the first openings defined in the functional display area is greater than the number density of the second openings defined in the main display area, the present disclosure can concentrate more light of large viewing angles in the functional display area. Therefore, a technical problem of brighter visual brightness at the large viewing angles in the functional display area can be relieved.

Specific embodiments are used to describe technical solutions of the present disclosure.

Figure 1:
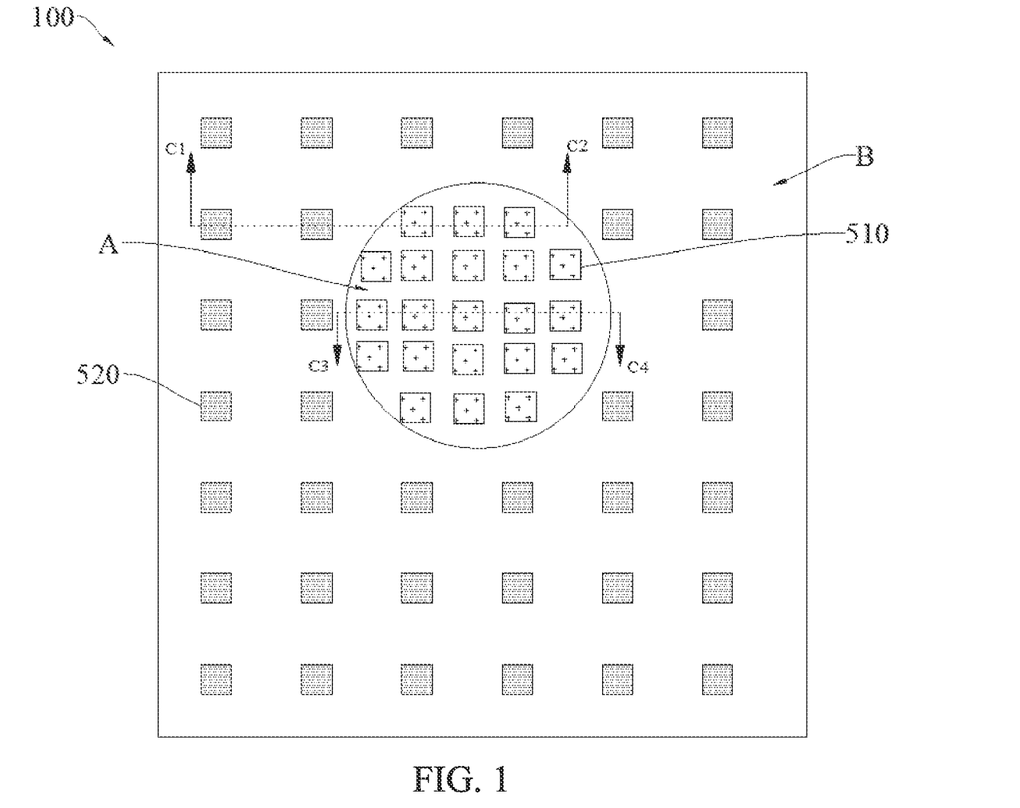
FIG. 1 is a schematic top view of a first structure of a display panel according to an embodiment of the present disclosure.
Figure 2:
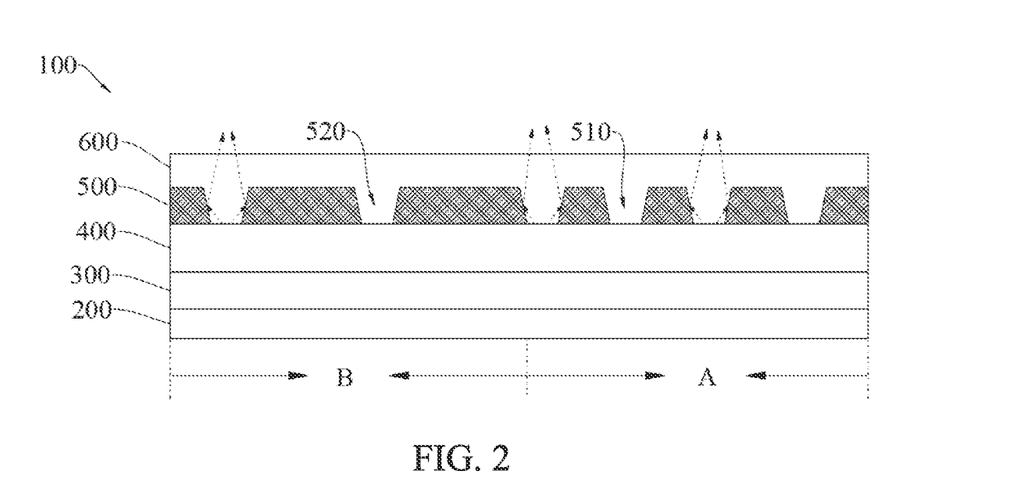
FIG. 2 is a first schematic structural diagram of a cross-section along a line C1-C2 in FIG. 1.

In this embodiment, referring to FIGS. 1 and 2, the display panel 100 has the functional display area A and the main display area B surrounding the functional display area A. The display panel 100 includes the substrate 200, the first refractive index layer 500 disposed on the substrate 200, and the second refractive index layer 600 disposed on the first refractive index layer 500.

In some embodiments, referring to FIG. 2, the display panel 100 also includes an array substrate 300 and a light-emitting functional layer 400 disposed between the substrate 200 and the first refractive index layer 500.

In some embodiments, referring to FIG. 2, the first refractive index layer 500 is disposed on the side of the substrate 200, and the second refractive index layer 600 is disposed on the side of the first refractive index layer 500 away from the substrate 200. The first refractive index layer 500 includes the plurality of first openings 510 and the plurality of second openings 520, the first openings 510 are distributed in the functional display area A, and the second openings 520 are distributed in the main display area B. The second refractive index layer 600 is filled in the first openings 510 and the second openings 520, and the refractive index of the second refractive index layer 600 is greater than the refractive index of the first refractive index layer 500.

Figure 3:
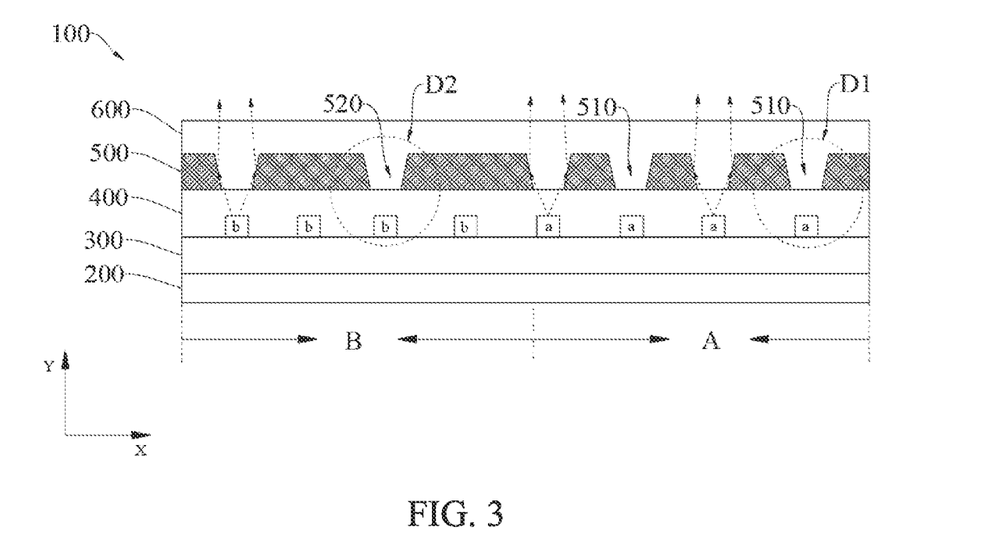
FIG. 3 is a second schematic structural diagram of the cross-section along the line C1-C2 in FIG. 1.
Figure 6:
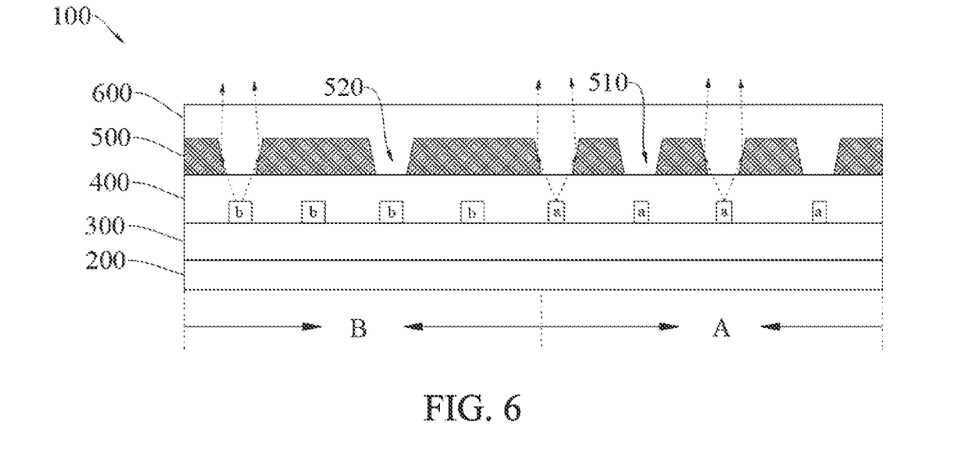
FIG. 6 is a third schematic structural diagram of the cross-section along the line C1-C2 in FIG. 1.

In FIGS. 2, 3, and 6, dashed arrows indicate paths of light. By filling the second refractive index layer 600 into the first openings 510 and the second openings 520, wherein, the refractive index of the second refractive index layer 600 is greater than the refractive index of the first refractive index layer 500, a convex prism effect can be realized, and light can be concentrated. At a same time, when the light is transmitted from the second refractive index layer 600 to the first refractive index layer 500 and the light travels to interfaces between the second refractive index layer 600 and the first refractive index layer 500, and when an incident angle is greater than a critical angle, the light will be totally reflected. Therefore, more light emitted from the light-emitting functional layer 400 can be concentrated and can be perpendicularly emitted out of the display panel 100. Therefore, more light of large viewing angles can be concentrated, so the technical problem of brighter visual brightness at the large viewing angles in the functional display area A can be relieved.

In some embodiments, referring to FIG. 3, the display panel 100 further includes the light-emitting functional layer 400 disposed between the substrate 200 and the first refractive index layer 500, and the light-emitting functional layer 400 includes a plurality of first sub-pixels disposed in the functional display area A and a plurality of second sub-pixels disposed in the main display area B. Wherein, a number density of the first sub-pixels is equal to a number density of the second sub-pixels.

In FIGS. 3 to 7, "a" denotes the first sub-pixels, and "b" denotes the second sub-pixels.

A pixel density in the functional display area A being same as a pixel density in the main display area B can reduce a difference in display fineness between the functional display area A and the main display area B, thereby improving overall visual quality of the display panel 100.

In some embodiments, referring to FIG. 6, a light-emitting area of the first sub-pixels is smaller than a light-emitting area of the second sub-pixels. The functional display area A corresponds to an under-screen optical module. While ensuring display fineness, reducing the light-emitting area of the first sub-pixels can improve a light-receiving ability of the under-screen optical module, thereby improving performances of the under-screen optical module.

In some embodiments, referring to FIG. 3, in a top view direction of the display panel 100, all the first sub-pixels are disposed in the first openings 510, a part of the second sub-pixels are disposed in the second openings 520, and another part of the second sub-pixels are disposed outside the second openings 520.

In the functional display area A, one of the first openings 510 corresponds to one of the first sub-pixels, while in the main display area B, not all second sub-pixels correspond to the second openings 520. That is, in per unit area, light from a larger number of the first sub-pixels can be concentrated, so brightness at a front viewing angle in the functional display area A can be improved, brightness at the large viewing angles can be reduced more, and a problem of the brighter brightness at the large viewing angles in the functional display area A can be compensated. Therefore, a brightness difference between the functional display area A and the main display area B at the large viewing angles can be reduced, thereby improving display quality.

In some embodiments, referring to FIG. 3, a ratio of a number of the first openings 510 to a number of the first sub-pixels is a first ratio, and a ratio of a number of the second openings 520 to a number of the second sub-pixels is a second ratio; and wherein, the first ratio is greater than the second ratio.

In a viewpoint of number ratios, the number density of the first openings 510 in the functional display area A is greater than the number density of the second openings 520 in the main display area B, so the light from the larger number of the first sub-pixels can be concentrated. Therefore, the brightness at the front viewing angle in the functional display area A can be improved, the brightness at the large viewing angles can be reduced more, and the problem of the brighter brightness at the large viewing angles in the functional display area A can be compensated. Therefore, the brightness difference between the functional display area A and the main display area B at the large viewing angles can be reduced, thereby improving the display quality.

In some embodiments, the first ratio may be 1:1, and the second ratio may be 1:2, so it can better relieve a brightness difference between the functional display area A and the main display area B when viewed at the large viewing angles, and ensure that a brightness difference when viewed at the front viewing angle is not obvious at a same time, thereby improving the display quality.

Figure 4:
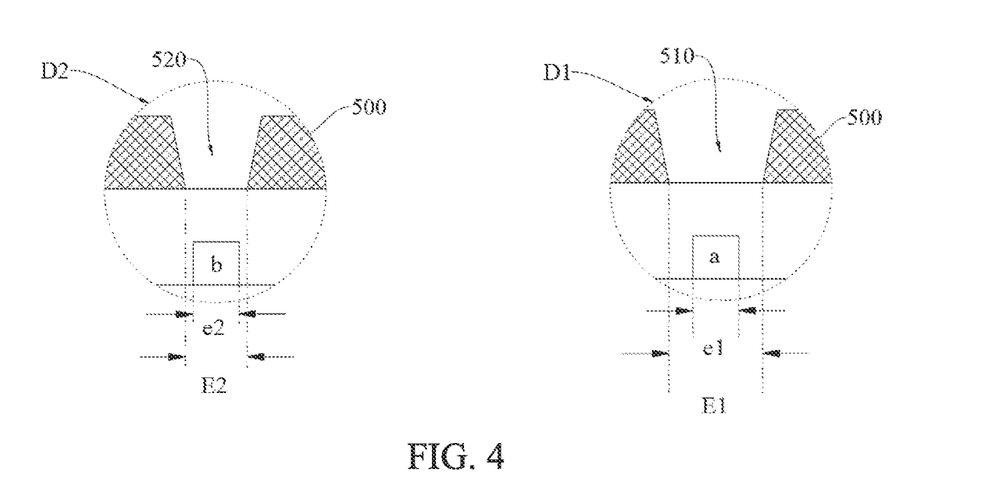
FIG. 4 is a first enlarged schematic diagram of areas D1 and D2 in FIG. 3.

In some embodiments, referring to FIG. 4, on a first cross-section, a bottom width of the first openings 510 is greater than a width of the first sub-pixels, a bottom width of the second openings 520 is greater than a width of the second sub-pixels, and the first cross-section is perpendicular to the display panel. Wherein, a difference value between a diameter of a bottom circumscribed circle of the first openings 510 and a diameter of a circumscribed circle of a light-emitting surface corresponding to the first sub-pixels is a first difference value, a difference value between a diameter of a bottom circumscribed circle of the second openings 520 and a diameter of a circumscribed circle of a light-emitting surface corresponding to the second sub-pixels is a second difference value, and the first difference value is greater than or equal to the second difference value. In FIG. 4, a cross-section along line C1-C2 of FIG. 1 may be taken as an example of the first cross-section, which is not specific limited.

In FIG. 4, "E1" denotes the diameter of the bottom circumscribed circle of the first openings 510, "e1" denotes the diameter of the circumscribed circle of the light-emitting surface corresponding to the first sub-pixels, "E2" denotes the diameter of the bottom circumscribed circle of the second openings 520, and "e2" denotes the diameter of the circumscribed circle of the light-emitting surface corresponding to the second sub-pixels. Then the first difference value is equal to E1-e1, and the second difference value is equal to E2-e2.

Taking the first difference value as an example, if the first difference value is larger, the first openings 510 are correspondingly wider than the first sub-pixels, and light corresponding to the first sub-pixels are more, so more light from the first sub-pixels can be concentrated, the brightness at the front viewing angle can be improved, and a relative brightness at a side viewing angle can be reduced. The first difference value is greater than or equal to the second difference value, so the light from the larger number of the first sub-pixels can be concentrated. Therefore, the brightness at the front viewing angle in the functional display area A can be improved, the brightness at the large viewing angles can be reduced more, and the problem of the brighter brightness at the large viewing angles in the functional display area A can be compensated. Therefore, the brightness difference between the functional display area A and the main display area B at the large viewing angles can be reduced, thereby improving the display quality.

Figure 5:
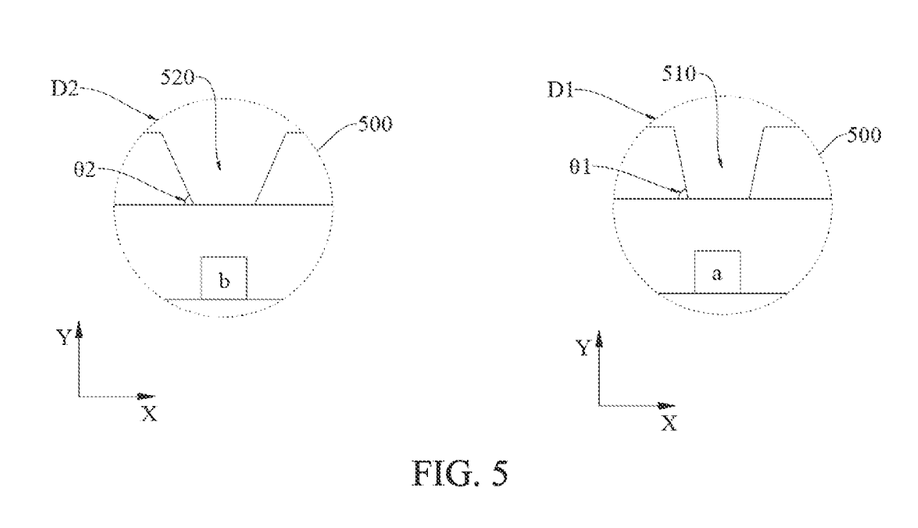
FIG. 5 is a second enlarged schematic diagram of the areas D1 and D2 in FIG. 3.

In some embodiments, referring to FIG. 5, an acute included angle between a side wall of the first openings 510 and a first plane is a first included angle $\theta 1$, and an acute included angle between a side wall of the second openings 520 and the first plane is a second included angle $\theta 2$. Wherein, the first plane is parallel to the substrate 200, and the first included angle $\theta 1$ is greater than or equal to the second included angle $\theta 2$.

Figure 7:
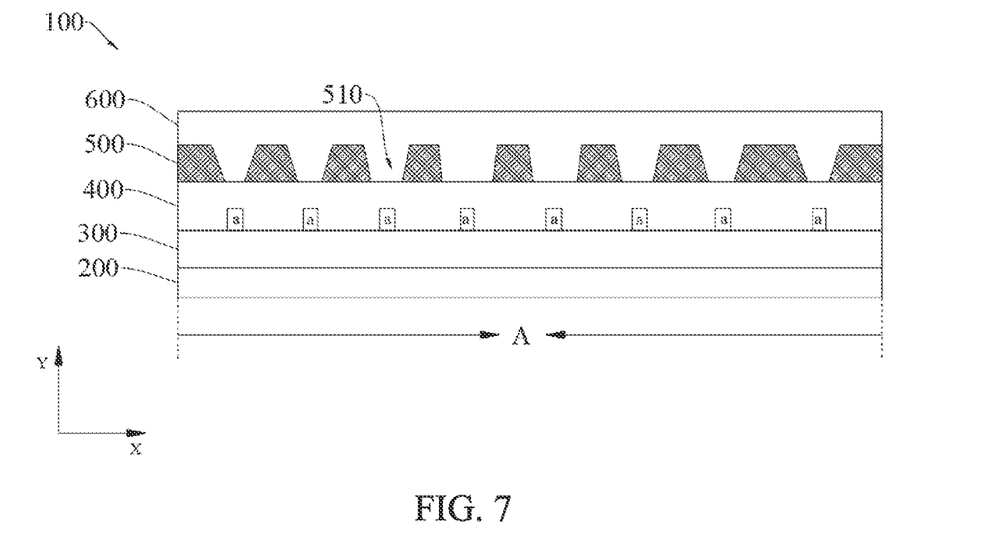
FIG. 7 is a schematic structural diagram of a cross-section along a line C3-C4 in FIG. 1.

In FIGS. 3, 5, and 7, the first plane is parallel to an X-axis direction.

Taking the first included angle $\theta 1$ as an example, if the first included angle $\theta 1$ is larger, which represents that the side wall of the first openings 510 is more perpendicular to the first plane, so more light can be exported to a direction of the front viewing angle, and more light from the first sub-pixels can be concentrated. Therefore, the brightness at the front viewing angle can be improved, and the relative brightness at the side viewing angle can be reduced. The first included angle $\theta 1$ is greater than or equal to the second included angle $\theta 2$, so the light from the larger number of the first sub-pixels can be concentrated. Therefore, the brightness at the front viewing angle in the functional display area A can be improved, the brightness at the large viewing angles can be reduced more, and the problem of the brighter brightness at the large viewing angles in the functional display area A can be compensated. Therefore, the brightness difference between the functional display area A and the main display area B at the large viewing angles can be reduced, thereby improving the display quality.

In some embodiments, the first difference value is greater than zero and is less than or equal to 1.5 um, that is, 0<first difference value≤1.5 um, and the second difference value is greater than zero and is less than or equal to 1.5 um, that is, 0<second difference value≤1.5 um. If a difference value is greater than this range, light of the large viewing angles will be overly concentrated, thereby causing it to be significantly darker when viewed at the side viewing angle.

In some embodiments, the first included angle θ1 is greater than or equal to 70° and is less than or equal to 85°, that is, 70°≤θ1≤85°, and the second included angle θ2 is greater than or equal to 70° and is less than or equal to 85°, that is, 70°≤θ2≤85°. If an included angle is not within this range, the light of the large viewing angles will be overly concentrated, thereby causing it to be significantly darker when viewed at the side viewing angle, or it is unable to realize light concentration.

In some embodiments, the first sub-pixels are one of first color pixels, second color pixels, or third color pixels, a light-emitting area of the first color pixels is greater than a light-emitting area of the second color pixels, and the light-emitting area of the second color pixels is greater than a light-emitting area of the third color pixels; The second sub-pixels are one of fourth color pixels, fifth color pixels, or sixth color pixels, a light-emitting area of the fourth color pixels is greater than a light-emitting area of the fifth color pixels, and the light-emitting area of the fifth color pixels is greater than a light-emitting area of the sixth color pixels; light-emitting colors of the first color pixels, the second color pixels, and the third color pixels are different, the light-emitting color of the first color pixels is same as a light-emitting color of the fourth color pixels, the light-emitting color of the second color pixels is same as a light-emitting color of the fifth color pixels, and the light-emitting color of the third color pixels is same as a light-emitting color of the sixth color pixels.

Pixels in the functional display area A are red, green, and blue, pixels in the main display area B are red, green, and blue, and the pixels with different colors have different areas. A specific comparison of the light-emitting areas can be changed according to different requirements and processes.

In some embodiments, a ratio of a number of the first openings 510 corresponding to the first color pixels to a number of the first color pixels is a third ratio, a ratio of a number of the second openings 520 corresponding to the fourth color pixels to a number of the fourth color pixels is a fourth ratio, a ratio of a number of the first openings 510 corresponding to the second color pixels to a number of the second color pixels is a fifth ratio, a ratio of a number of the second openings 520 corresponding to the fifth color pixels to a number of the fifth color pixels is a sixth ratio, a ratio of a number of the first openings 510 corresponding to the third color pixels to a number of the third color pixels is a seventh ratio, and a ratio of a number of the second openings 520 corresponding to the sixth color pixels to a number of the sixth color pixels is an eighth ratio.

The third ratio is greater than the fourth ratio, and the fifth ratio, the sixth ratio, the seventh ratio, and the eighth ratio are all equal to each other; or the third ratio is greater than the fourth ratio, the fifth ratio is greater than the sixth ratio, and the seventh ratio is equal to the eighth ratio.

The light-emitting colors of the first color pixels and the fourth color pixels are the same, and both have a largest light-emitting area in their display areas. By optimizing color pixels with the largest light-emitting area, for the third ratio greater than the fourth ratio, convex prism densities of the color pixels having the largest light-emitting area are optimized. That is, the third ratio is greater than the fourth ratio, and the fifth ratio, the sixth ratio, the seventh ratio, and the eighth ratio are all equal to each other.

Or convex prism densities of two kinds of the color pixels having larger light-emitting areas are optimized, that is, the third ratio is greater than the fourth ratio, the fifth ratio is greater than the sixth ratio, and the seventh ratio is equal to the eighth ratio.

For pixels having a same color, a convex prism density thereof in the functional display area A is larger than a convex prism density in the main display area B, so light of a larger number of the pixels having the same color in the functional display area A can be concentrated. If the light-emitting area is larger, overall light concentration effect is more obvious. Therefore, the brightness at the front viewing angle in the functional display area A can be improved, the brightness at the large viewing angles can be reduced more, and the problem of the brighter brightness at the large viewing angles in the functional display area A can be compensated. Therefore, the brightness difference between the functional display area A and the main display area B at the large viewing angles can be reduced, thereby improving the display quality.

In some embodiments, an acute included angle between a side wall of the first openings 510 corresponding to the first color pixels and the first plane is a third included angle, an acute included angle between a side wall of the first openings 510 corresponding to the second color pixels and the first plane is a fourth included angle, and an acute included angle between a side wall of the first openings 510 corresponding to the third color pixels and the first plane is a fifth included angle. An acute included angle between a side wall of the second openings 520 corresponding to the fourth color pixels and the first plane is a sixth included angle, an acute included angle between a side wall of the second openings 520 corresponding to the fifth color pixels and the first plane is a seventh included angle, and an acute included angle between a side wall of the second openings 520 corresponding to the sixth color pixels and the first plane is an eighth included angle.

The third included angle is greater than the fourth included angle, the third included angle is greater than the fifth included angle, the sixth included angle is greater than the seventh included angle, and the sixth included angle is greater than the eighth included angle.

For different color pixels, a side wall of openings corresponding to sub-pixels having a larger light-emitting area has a more vertical slope, which can export more light to the direction of the front viewing angle. Therefore, the brightness at the front viewing angle can be improved more easily, and the relative brightness at the side viewing angle can be reduced. Therefore, the brightness at the front viewing angle in the functional display area A can be improved more easily, the brightness at the large viewing angles can be reduced more, and the problem of the brighter brightness at the large viewing angles in the functional display area A can be compensated. Therefore, the brightness difference between the functional display area A and the main display area B at the large viewing angles can be reduced, thereby improving the display quality.

In some embodiments, a difference value between a diameter of a bottom circumscribed circle of the first openings 510 corresponding to the first color pixels and a diameter of a circumscribed circle of a light-emitting surface corresponding to the first color pixels is a third difference value, a difference value between a diameter of a bottom circumscribed circle of the first openings 510 corresponding to the second color pixels and a diameter of a circumscribed circle of a light-emitting surface corresponding to the second color pixels is a fourth difference value, and a difference value between a diameter of a bottom circumscribed circle of the first openings 510 corresponding to the third color pixels and a diameter of a circumscribed circle of a light-emitting surface corresponding to the third color pixels is a fifth difference value. A difference value between a diameter of a bottom circumscribed circle of the second openings 520 corresponding to the fourth color pixels and a diameter of a circumscribed circle of a light-emitting surface corresponding to the fourth color pixels is a sixth difference value, a difference value between a diameter of a bottom circumscribed circle of the second openings 520 corresponding to the fifth color pixels and a diameter of a circumscribed circle of a light-emitting surface corresponding to the fifth color pixels is a seventh difference value, and a difference value between a diameter of a bottom circumscribed circle of the second openings 520 corresponding to the sixth color pixels and a diameter of a circumscribed circle of a light-emitting surface corresponding to the sixth color pixels is an eighth difference value.

The third difference value is greater than the fourth difference value, the third difference value is greater than the fifth difference value, the sixth difference value is greater than the seventh difference value, and the sixth difference value is greater than the eighth difference value.

For different color pixels, if a difference value between a diameter of a bottom circumscribed circle of openings corresponding to sub-pixels having a larger light-emitting area and a diameter of a circumscribed circle of a light-emitting surface corresponding to the sub-pixels having the larger light-emitting area is larger, more light of the larger light-emitting area can be exported to the direction of the front viewing angle. Therefore, the brightness at the front viewing angle can be improved more easily, and the relative brightness at the side viewing angle can be reduced. Therefore, the brightness at the front viewing angle in the functional display area A can be improved more easily, the brightness at the large viewing angles can be reduced more, and the problem of the brighter brightness at the large viewing angles in the functional display area A can be compensated. Therefore, the brightness difference between the functional display area A and the main display area B at the large viewing angles can be reduced, thereby improving the display quality.

In some embodiments, the light-emitting color of the first color pixels is blue, the light-emitting color of the second color pixels is red, and the light-emitting color of the third color pixels is green. A cost of blue light-emitting materials is low, so a light-emitting area of blue light pixels is set to be the largest. Human eyes are more sensitive to green light, and a visual effect can be obtained with a smaller light-emitting area, so a light-emitting area of green light pixels is set to be the smallest.

In some embodiments, referring to FIG. 7, in a direction from a periphery of the functional display area A to a center of the functional display area A, a difference value between the diameter of the bottom circumscribed circle of the first openings 510 and the diameter of the circumscribed circle of the light-emitting surface corresponding to the first sub-pixels is gradually increased, and the acute included angle between the side wall of the first openings 510 and a horizontal plane is gradually increased.

In actual effects, in a direction closer to the center of the functional display area A, luminous brightness is large, especially when viewed from the side viewing angle. Therefore, light in the direction closer to the center of the functional display area A can be concentrated and extracted more by gradually increasing the difference value between the diameter of the bottom circumscribed circle of the first openings 510 and the diameter of the circumscribed circle of the light-emitting surface corresponding to the first sub-pixels, and gradually increasing the acute included angle between the side wall of the first openings 510 and the horizontal plane in the direction closer to the center of the functional display area A.

In some embodiments, the array substrate 300 includes an active layer disposed on the substrate, a first insulating layer disposed on the active layer, a gate electrode layer disposed on the first insulating layer, a second insulating layer disposed on the gate electrode layer, a source and drain electrode layer disposed on the second insulating layer, and a third insulating layer disposed on the source and drain electrode layer.

In some embodiments, the light-emitting functional layer includes an anode layer disposed on the third insulating layer, a light-emitting material layer disposed on the anode layer, and a cathode layer disposed on the light-emitting material layer. The display panel 100 also includes a pixel definition layer disposed on a same layer as the light-emitting material layer.

In some embodiments, the display panel 100 further includes a flexible coverplate disposed on the second refractive index layer 600. The display panel 100 further includes corresponding adhesive layers that are respectively disposed between a polarizing layer and the flexible coverplate, between the light-emitting functional layer and the polarizing layer, and between a backplate and the substrate.

In some embodiments, the light-emitting functional layer may include organic light-emitting diode (OLED, organic light-emitting semiconductor) materials, or may include micro-LEDs or mini-LEDs, which is not specifically limited herein.

By defining the first openings and the second openings on the first transparent layer and filling the second transparent layer that has the larger refractive index into the first openings and the second openings to form the micro-lens structures, wherein, the number density of the first openings defined in the functional display area is greater than the number density of the second openings defined in the main display area, the present disclosure can concentrate more light of large viewing angles in the functional display area.

Therefore, the technical problem of brighter visual brightness at the large viewing angles in the functional display area can be relieved.

Figure 8:
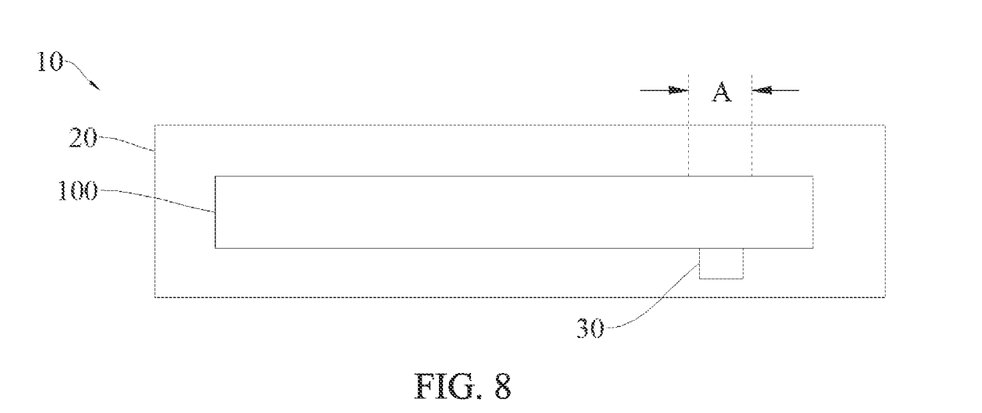
FIG. 8 is a schematic structural diagram of a mobile terminal according to an embodiment of the present disclosure.

Referring to FIG. 8, an embodiment of the present disclosure further provides a mobile terminal 10, which includes the display panel 100 mentioned above, an under-screen optical module 30, and a terminal body 20, wherein, the terminal body 20, the under-screen optical module 30, and the display panel 100 are combined into one integrated structure.

A specific structure of the display panel 100 can be referred to any one of the embodiments of the display panel 100 and FIGS. 1 to 7 and will not be repeated herein.

In this embodiment, the terminal body 20 may include a middle frame, a sealant, etc., and the mobile terminal 10 may be a mobile display terminal, such as a mobile phone or a tablet, which is not limited herein.

In some embodiments, the mobile terminal 10 further includes the under-screen optical module 30, which is correspondingly disposed in the functional display area A.

In some embodiments, the under-screen optical module 30 may be one of a camera, an optical fingerprint sensor, an infrared sensor, or a distance sensor.

The embodiments of the present disclosure provide the display panel and the mobile terminal. The display panel includes the functional display area and the main display area. The display panel includes the substrate, and the first refractive index layer and the second refractive index layer disposed on the substrate in sequence. The first refractive index layer includes the plurality of first openings distributed in the functional display area and the plurality of second openings distributed in the main display area. The second refractive index layer is filled in the first openings and the second openings, and the refractive index of the second refractive index layer is greater than the refractive index of the first refractive index layer. The number density of the first openings is greater than the number density of the second openings. By filling the second transparent layer that has the larger refractive index into the first openings and the second openings of the first transparent layer to form the micro-lens structures, wherein, the number density of the first openings defined in the functional display area is greater than the number density of the second openings defined in the main display area, the present disclosure can concentrate more light of large viewing angles in the functional display area. Therefore, the problem of brighter visual brightness at the large viewing angles in the functional display area can be relieved.

It can be understood that for a person of ordinary skill in the art, equivalent replacements or changes can be made according to the technical solution of the present disclosure and its inventive concept, and all these changes or replacements should fall within the protection scope of the claims attached to the present disclosure.

What is claimed is:

1. A display panel, having a functional display area and a main display area surrounding the functional display area and comprising:
   a substrate;
   a first refractive index layer disposed on one side of the substrate and comprising a plurality of first openings and a plurality of second openings, wherein the first openings are distributed in the functional display area, and the second openings are distributed in the main display area; and
   a second refractive index layer disposed on one side of the first refractive index layer away from the substrate and filled in the first openings and the second openings, wherein a refractive index of the second refractive index layer is greater than a refractive index of the first refractive index layer;
   wherein a number density of the first openings is greater than a number density of the second openings,
   wherein the display panel further comprising a light-emitting functional layer disposed between the substrate and the first refractive index layer, wherein the light-emitting functional layer comprises a plurality of first sub-pixels disposed in the functional display area and a plurality of second sub-pixels disposed in the main display area;
   wherein a number density of the first sub-pixels is equal to a number density of the second sub-pixels,
   wherein in a top view direction of the display panel, all the first sub-pixels are disposed in the first openings, a part of the second sub-pixels are disposed in the second openings, and another part of the second sub-pixels are disposed outside the second openings.

2. The display panel according to claim 1, wherein a ratio of a number of the first openings to a number of the first sub-pixels is a first ratio, and a ratio of a number of the second openings to a number of the second sub-pixels is a second ratio; and
   wherein the first ratio is greater than the second ratio.

3. The display panel according to claim 1, wherein on a first cross-section, a bottom width of the first openings is greater than a width of the first sub-pixels, a bottom width of the second openings is greater than a width of the second sub-pixels, and the first cross-section is perpendicular to the display panel; and
   a difference value between a diameter of a bottom circumscribed circle of the first openings and a diameter of a circumscribed circle of a light-emitting surface corresponding to the first sub-pixels is a first difference value, a difference value between a diameter of a bottom circumscribed circle of the second openings and a diameter of a circumscribed circle of a light-emitting surface corresponding to the second sub-pixels is a second difference value, and the first difference value is greater than or equal to the second difference value.

4. The display panel according to claim 3, wherein the first difference value is greater than zero and is less than or equal to 1.5 um, and the second difference value is greater than zero and is less than or equal to 1.5 um.

5. The display panel according to claim 1, wherein an acute included angle between a side wall of the first openings and a first plane is a first included angle, and an acute included angle between a side wall of the second openings and the first plane is a second included angle; and
   wherein the first plane is parallel to the substrate, and the first included angle is greater than or equal to the second included angle.

6. The display panel according to claim 5, wherein the first included angle ranges from 70° to 85°, and the second included angle ranges from 70° to 85°.

7. The display panel according to claim 2, wherein the first sub-pixels are one of first color pixels, second color pixels, or third color pixels, a light-emitting area of the first color pixels is greater than a light-emitting area of the second color pixels, and the light-emitting area of the second color pixels is greater than a light-emitting area of the third color pixels;
   the second sub-pixels are one of fourth color pixels, fifth color pixels, or sixth color pixels, a light-emitting area of the fourth color pixels is greater than a light-emitting area of the fifth color pixels, and the light-emitting area of the fifth color pixels is greater than a light-emitting area of the sixth color pixels;
   light-emitting colors of the first color pixels, the second color pixels, and the third color pixels are different, the light-emitting color of the first color pixels is same as a light-emitting color of the fourth color pixels, the light-emitting color of the second color pixels is same as a light-emitting color of the fifth color pixels, and the light-emitting color of the third color pixels is same as a light-emitting color of the sixth color pixels;
   a ratio of a number of the first openings corresponding to the first color pixels to a number of the first color pixels is a third ratio, a ratio of a number of the second openings corresponding to the fourth color pixels to a number of the fourth color pixels is a fourth ratio, a ratio of a number of the first openings corresponding to the second color pixels to a number of the second color pixels is a fifth ratio, a ratio of a number of the second openings corresponding to the fifth color pixels to a number of the fifth color pixels is a sixth ratio, a ratio of a number of the first openings corresponding to the third color pixels to a number of the third color pixels is a seventh ratio, and a ratio of a number of the second openings corresponding to the sixth color pixels to a number of the sixth color pixels is an eighth ratio; and
the third ratio is greater than the fourth ratio, and the fifth ratio, the sixth ratio, the seventh ratio, and the eighth ratio are all equal to each other; or the third ratio is greater than the fourth ratio, the fifth ratio is greater than the sixth ratio, and the seventh ratio is equal to the eighth ratio.

8. The display panel according to claim 7, wherein the light-emitting color of the first color pixels is blue, the light-emitting color of the second color pixels is red, and the light-emitting color of the third color pixels is green.

9. The display panel according to claim 1, wherein in a direction from a periphery of the functional display area to a center of the functional display area, a difference value between a diameter of a bottom circumscribed circle of the first openings and a diameter of a circumscribed circle of a light-emitting surface corresponding to the first sub-pixels is gradually increased, and an acute included angle between a side wall of the first openings and a horizontal plane is gradually increased.

10. A mobile terminal, comprising a display panel, an under-screen optical module, and a terminal body, wherein the under-screen optical module is correspondingly disposed in a functional display area, and the terminal body, the under-screen optical module, and the display panel are combined into one integrated structure;
wherein the display panel has the functional display area and a main display area surrounding the functional display area and comprises:
a substrate;
a first refractive index layer disposed on one side of the substrate and comprising a plurality of first openings and a plurality of second openings, wherein the first openings are distributed in the functional display area, and the second openings are distributed in the main display area; and
a second refractive index layer disposed on one side of the first refractive index layer away from the substrate and filled in the first openings and the second openings, wherein a refractive index of the second refractive index layer is greater than a refractive index of the first refractive index layer;
wherein a number density of the first openings is greater than a number density of the second openings,
wherein the display panel further comprising a light-emitting functional layer disposed between the substrate and the first refractive index layer, wherein the light-emitting functional layer comprises a plurality of first sub-pixels disposed in the functional display area and a plurality of second sub-pixels disposed in the main display area;
wherein a number density of the first sub-pixels is equal to a number density of the second sub-pixels,
wherein in a top view direction of the display panel, all the first sub-pixels are disposed in the first openings, a part of the second sub-pixels are disposed in the second openings, and another part of the second sub-pixels are disposed outside the second openings.

11. The mobile terminal according to claim 10, wherein a ratio of a number of the first openings to a number of the first sub-pixels is a first ratio, and a ratio of a number of the second openings to a number of the second sub-pixels is a second ratio; and
wherein the first ratio is greater than the second ratio.

12. The mobile terminal according to claim 10, wherein on a first cross-section, a bottom width of the first openings is greater than a width of the first sub-pixels, a bottom width of the second openings is greater than a width of the second sub-pixels, and the first cross-section is perpendicular to the display panel; and
a difference value between a diameter of a bottom circumscribed circle of the first openings and a diameter of a circumscribed circle of a light-emitting surface corresponding to the first sub-pixels is a first difference value, a difference value between a diameter of a bottom circumscribed circle of the second openings and a diameter of a circumscribed circle of a light-emitting surface corresponding to the second sub-pixels is a second difference value, and the first difference value is greater than or equal to the second difference value.

13. The mobile terminal according to claim 12, wherein the first difference value is greater than zero and is less than or equal to 1.5 um, and the second difference value is greater than zero and is less than or equal to 1.5 um.

14. The mobile terminal according to claim 10, wherein an acute included angle between a side wall of the first openings and a first plane is a first included angle, and an acute included angle between a side wall of the second openings and the first plane is a second included angle; and
wherein the first plane is parallel to the substrate, and the first included angle is greater than or equal to the second included angle.

15. The mobile terminal according to claim 14, wherein the first included angle ranges from 70° to 85°, and the second included angle ranges from 70° to 85°.

16. The mobile terminal according to claim 11, wherein the first sub-pixels are one of first color pixels, second color pixels, or third color pixels, a light-emitting area of the first color pixels is greater than a light-emitting area of the second color pixels, and the light-emitting area of the second color pixels is greater than a light-emitting area of the third color pixels;
the second sub-pixels are one of fourth color pixels, fifth color pixels, or sixth color pixels, a light-emitting area of the fourth color pixels is greater than a light-emitting area of the fifth color pixels, and the light-emitting area of the fifth color pixels is greater than a light-emitting area of the sixth color pixels;
light-emitting colors of the first color pixels, the second color pixels, and the third color pixels are different, the light-emitting color of the first color pixels is same as a light-emitting color of the fourth color pixels, the light-emitting color of the second color pixels is same as a light-emitting color of the fifth color pixels, and the light-emitting color of the third color pixels is same as a light-emitting color of the sixth color pixels;
a ratio of a number of the first openings corresponding to the first color pixels to a number of the first color pixels is a third ratio, a ratio of a number of the second openings corresponding to the fourth color pixels to a number of the fourth color pixels is a fourth ratio, a ratio of a number of the first openings corresponding to the second color pixels to a number of the second color pixels is a fifth ratio, a ratio of a number of the second openings corresponding to the fifth color pixels to a number of the fifth color pixels is a sixth ratio, a ratio of a number of the first openings corresponding to the third color pixels to a number of the third color pixels is a seventh ratio, and a ratio of a number of the second openings corresponding to the sixth color pixels to a number of the sixth color pixels is an eighth ratio; and the third ratio is greater than the fourth ratio, and the fifth ratio, the sixth ratio, the seventh ratio, and the eighth ratio are all equal to each other; or the third ratio is greater than the fourth ratio, the fifth ratio is greater than the sixth ratio, and the seventh ratio is equal to the eighth ratio.

* * * * *